(12) United States Patent
Liu

(10) Patent No.: US 8,553,166 B2
(45) Date of Patent: Oct. 8, 2013

(54) TFT-LCD ARRAY SUBSTRATE AND MANUFACTURING METHOD THEREOF

(75) Inventor: Xiang Liu, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 467 days.

(21) Appl. No.: 12/837,821

(22) Filed: Jul. 16, 2010

(65) Prior Publication Data

US 2011/0013106 A1    Jan. 20, 2011

(30) Foreign Application Priority Data

Jul. 17, 2009   (CN) .......................... 2009 1 0089402

(51) Int. Cl.
*G02F 1/136* (2006.01)
(52) U.S. Cl.
USPC ............................................... 349/46; 349/43
(58) Field of Classification Search
None
See application file for complete search history.

(56) References Cited

U.S. PATENT DOCUMENTS

| 5,614,730 | A | * | 3/1997 | Nakazawa et al. | ............. 257/59 |
| 6,067,132 | A | * | 5/2000 | Kim | ............................... 349/47 |
| 2005/0219435 | A1 | | 10/2005 | Oh et al. | |
| 2008/0049158 | A1 | * | 2/2008 | Choi | ............................. 349/46 |
| 2009/0068801 | A1 | | 3/2009 | Song | |

FOREIGN PATENT DOCUMENTS

| CN | 1782828 A | 6/2006 |
| CN | 101382712 A | 3/2009 |
| JP | 2004-317685 A | 11/2004 |

* cited by examiner

*Primary Examiner* — Thanh-Nhan P Nguyen
(74) *Attorney, Agent, or Firm* — Ladas & Parry LLP

(57) ABSTRACT

A thin film transistor liquid crystal display (TFT-LCD) array substrate comprises a plurality of gate lines and a plurality of data lines on a substrate. A plurality of pixel regions are defined by the gate lines and the data lines. Each of the pixel regions comprises a pixel electrode and a thin film transistor serving as a switch element. The gate electrode of the thin film transistor is connected with a corresponding gate line through a connection electrode, and the gate electrode is formed by a material layer different from that forming the gate lines.

16 Claims, 10 Drawing Sheets

TFT-LCD ARRAY SUBSTRATE AND MANUFACTURING METHOD THEREOF

BACKGROUND

Embodiments of the present invention relate to a thin film transistor liquid crystal display (TFT-LCD) and a method of manufacturing the same.

Thin film transistor liquid crystal displays (TFT-LCDs) have the advantages of small volume, low energy consumption, low radiation, etc., and are gradually prevailing in the market of flat plate displays. A TFT-LCD is mainly constituted by an array substrate and a color filter substrate assembled to face to each other. A plurality of thin film transistors and a plurality of pixel electrodes are arranged on the array substrate in matrix, and each of the pixel electrodes is controlled by a thin film transistor. The pixel electrode is charged when the thin film transistor is turned-on. After charging, the voltage of the pixel electrode remains unchanged until the next time of turn-on of the thin film transistor.

Because of parasitic capacitance between the drain electrode and the gate electrode of the thin film transistor, a kickback voltage $\Delta V_p$ is generated at the moment the charging of the pixel electrode is finished. The kickback voltage $\Delta V_p$ is expressed as follows:

$$\Delta V_p = (V_{gh} - V_{gl})\frac{C_{gd}}{C_{gd} + C_{lc} + C_s},$$

where $V_{gh}$ is the turn-on voltage of the gate electrode, $V_{gl}$ is the turn-off voltage of the gate electrode, $C_{lc}$ is the liquid crystal capacitance of the pixel, $C_{gd}$ is the parasitic capacitance, and $C_s$ is the storage capacitance. Researches have shown that the polarity of the pixel electrode can vary due to the kickback voltage $\Delta V_p$ by the parasitic capacitance, and thus the voltage difference between the positive and the negative polarities varies, which causes flickers on the displayed image and thus severe deterioration of the display quality.

Presently, in forming a TFT-LCD array substrate, a wet etching process is typically employed to form the gate electrodes of thin film transistors. Since the gate electrodes are made by a metal film with a relatively large thickness (such as 3000-6000 Å) and the wet etching process shows a relatively poor uniformity, the inclination angles of side surfaces of the gate electrodes as well as the areas occupied by the side surfaces vary among different positions on same one mother substrate. One side surface of each gate electrode is positioned within the overlapping region between the gate electrode and the corresponding drain electrode. When the inclination angle of the side surface of the gate electrode is small, the overlapping area between the drain electrode and the gate electrode becomes large; when the inclination angle of the side surface of the gate electrode is large, the overlapping area between the drain electrode and the gate electrode becomes small. That is, the inclination angle of the side surface of the gate electrode imposes a direct influence on the overlapping area between the drain electrode and the gate electrode. In addition, according to the formula defining the capacitance, the parasitic capacitance is directly proportional to the above-described overlapping area. Therefore, in the case that the inclination angles of side surface of the gate electrodes vary among different positions of the mother substrate, the parasitic capacitance of the thin film transistors among the different positions varies, and accordingly the kickback voltages $\Delta V_p$ of the thin film transistors also vary among the different positions of the mother substrate. Furthermore, in forming the liquid crystal panel of a large area, both the area of the mother substrate and the thickness of the gate electrodes are large, and thus the variation of the inclination angles of side surface among the gate electrodes becomes more considerable over the mother substrate. Therefore, the variation of the parasitic capacitance among the thin film transistors is aggravated, and accordingly the variation among the kickback voltages $\Delta V_p$ of the thin film transistors is also aggravated. In the case that the variation among the kickback voltages $\Delta V_p$ is aggravated, the adjustment by a drive circuit becomes more difficult, which may cause more flickers on the displayed image and more severe deterioration of the display quality.

SUMMARY

According to an embodiment of the invention, a TFT-LCD array substrate is provided. The TFT-LCD array substrate comprises a plurality of gate lines and a plurality of data lines on a substrate. A plurality of pixel regions are defined by the gate lines and the data lines. Each of the pixel regions comprises a pixel electrode and a thin film transistor serving as a switch element. The gate electrode of the thin film transistor is connected with a corresponding gate line through a connection electrode, and the gate electrode is formed by a material layer different from that forming the gate lines.

According to another embodiment of the invention, a method of manufacturing a TFT-LCD array substrate is provided. The method of manufacturing the TFT-LCD array substrate comprises the following steps: Step 11 of depositing a gate metal film on a substrate, and forming a gate line by patterning the gate metal film; Step 12 of sequentially depositing a first insulating layer and a structural layer for forming a gate electrode and a pixel electrode on the substrate after the Step 11, and forming the gate electrode and the pixel electrode by patterning the structural layer; Step 13 of sequentially depositing a second insulating layer, a semiconductor film and a doped semiconductor film on the substrate after the Step 12, and forming an active layer and a first via hole, a second via hole and a third via hole provided in the second insulating layer by patterning the stack of the above layers, wherein the active layer comprises a semiconductor layer and a doped semiconductor layer and is positioned on the gate electrode, the first via hole is positioned at the pixel electrode, the second via hole is positioned at the gate electrode and the third via hole is positioned at the gate line; Step 14 of depositing a source/drain metal film on the substrate after the Step 13, and forming a data line, a drain electrode, a source electrode and a connection electrode by patterning the source/drain metal film, wherein the source electrode is positioned on the active layer and connected with the data line, the drain electrode is positioned on the active layer and connected with the pixel electrode through the first via hole, one end of the connection electrode is connected with the gate electrode through the second via hole and the other end thereof is connected with the gate line through the third via hole; and Step 15 of depositing a third insulating layer on the substrate after the Step 14.

According to still another embodiment of the invention, a method of manufacturing a TFT-LCD array substrate is provided. The method of manufacturing the TFT-LCD array substrate comprises the following steps: Step 21 of depositing a light-blocking film on a substrate, and forming a blocking layer by patterning the light-blocking film; Step 22 of depositing a semiconductor film, a doped semiconductor film and a source/drain metal film on the substrate after the Step 21, and forming an active layer, a data line, a source electrode and a drain electrode by patterning the stack of the above layers; Step 23 of depositing a first insulating layer on the substrate after the Step 22, and forming a first via hole by patterning the first insulating layer, wherein the first via hole is positioned at the drain electrode; Step 24 of depositing a transparent conductive film and a gate metal film on the substrate after the Step 23, and forming a gate electrode, a pixel electrode, a gate line and a connection electrode by patterning the stack of the transparent conductive film and the gate metal film, wherein the pixel electrode is connected with the drain electrode through the first via hole, the gate electrode formed by the transparent conductive film is positioned over the blocking layer, and one end of the connection electrode is provided on and contacts the gate electrode and the other end thereof is connected with the gate line.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Hereinafter, the embodiments of the invention will be described in detail with reference to the accompanying drawings.

Figure 1:
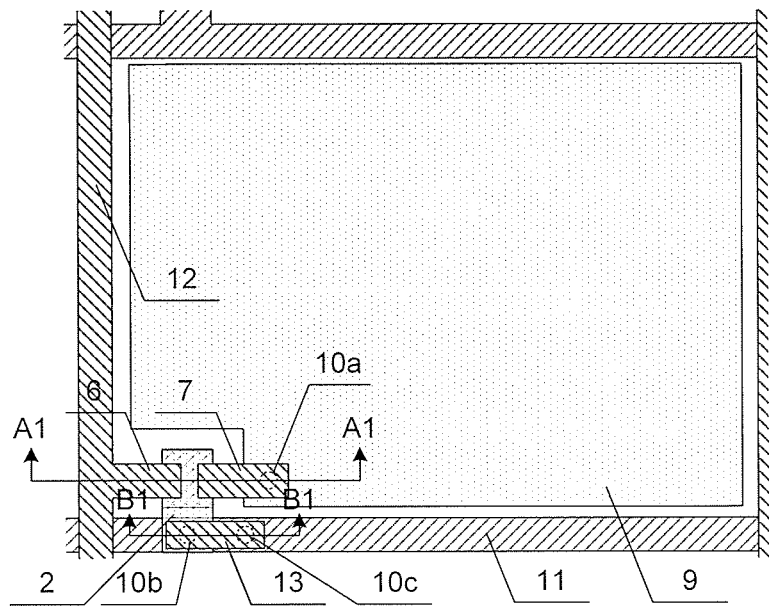
FIG. 1 is a plan view showing a first embodiment of a TFT-LCD array substrate according to the invention.
Figure 2:
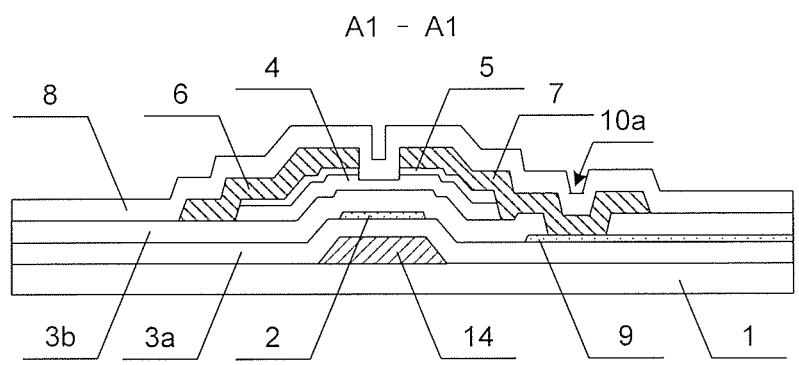
FIG. 2 is a sectional view taken along line A1-A1 in FIG. 1.
Figure 3:
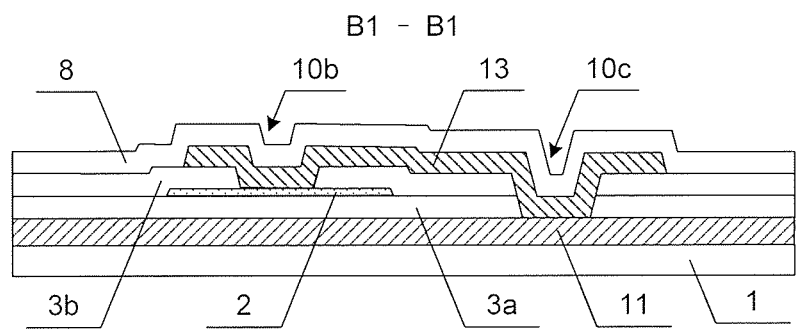
FIG. 3 is a sectional view taken along line B1-B1 in FIG. 1.

FIG. 1 is a plan view showing a first embodiment of a TFT-LCD array substrate according to the invention, FIG. 2 is a sectional view taken along line A1-A1 in FIG. 1, and FIG. 3 is a sectional view taken along line B1-B1 in FIG. 1.

As shown in FIG. 1 to FIG. 3, the TFT-LCD array substrate in this embodiment is in a bottom gate configuration and comprises a plurality of gate lines 11, a plurality of data lines 12, a plurality of pixel electrodes and a plurality of thin film transistors, which are all formed on a substrate 1. The thin film transistor is a bottom gate type transistor. A plurality of pixel regions are defined by intersecting the gate lines 11 and the data lines 12 perpendicular to each other. In each of the pixel regions, one thin film transistor serving as switch element and one pixel electrode 9 are provided. The gate lines 11 are used to supply the turn-on signals to the thin film transistors, and the data lines 12 are used to supply the data signals to the pixel electrodes 9. The gate electrodes of the thin film transistors are formed by a transparent conductive film with a small thickness. For example, the thickness of the transparent conductive film is 300-600 Å. Because the gate electrodes are formed by the transparent conductive film and the transparent conductive film has a small thickness (such as 300-600 Å) as described above, both the variation of the inclination angles of side surface among the gate electrodes and that of the areas occupied by the gate electrode side surfaces can be decreased, thus the influence of the inclination angle of side surface of each gate electrode on the overlapping area between the gate electrode and the corresponding drain electrode can be decreased. Therefore, the variation of the parasitic capacitance of the thin film transistors at different positions over the array substrate can be decreased, and accordingly the variation of the kickback voltages $\Delta V_p$ among the thin film transistor can also be decreased.

Specifically, the TFT-LCD array substrate in this embodiment comprises the gate line 11 and a blocking layer 14 on the substrate 1. A first insulating layer 3a is formed on the gate line 11 and the blocking layer 4 to cover the entirety of the substrate 1. The gate electrode 2 of the thin film transistor and a pixel electrode 9, both of which are formed by the transparent conductive film, are provided on the first insulating layer 3a. The gate electrode 2 is positioned over the blocking layer 14. The pixel electrode 9 is positioned within one pixel region. A second insulating layer 3b is formed on the gate electrode 2 and the pixel electrode 9 to covers the entirety of the substrate 1. A first via hole 10a, a second via hole 10b and a third via hole 10c are provided in the second insulating layer 3b. The first via hole 10a is positioned at the pixel electrode 9, the second via hole 10b is positioned at the gate electrode 2 and the third via hole 10c is positioned at the gate line 11. An active layer (for example, comprising a semiconductor layer 4 and a doped semiconductor layer 5 stacked together) is formed on the second insulating layer 3b and the gate electrode 2. A source electrode 6, a drain electrode 7, the data line 12 and a connection electrode 13 are formed on the substrate 1 with the above-described patterns. One end of the source electrode 6 is positioned on the active layer, and the other end thereof is connected with the data line 12. One end of the drain electrode 7 is positioned on the active layer, and the other end thereof is connected with the pixel electrode 9 through the first via hole 10a. A TFT channel region is formed between the source electrode 6 and the drain electrode 7. In the TFT channel region, the doped semiconductor layer 5 is etched away and the semiconductor layer 4 is partially etched in the thickness direction thereof so that the semiconductor layer 4 is exposed. One end of the connection electrode 13 is connected with the gate electrode 2 through the second via hole 10b and the other end thereof is connected with the gate line 11 through the third via hole 10c so that the gate electrode 2 and the gate line 11 are connected with each other through the connection electrode 13. A third insulating layer 8 is formed on the data line 12, the source electrode 6, the drain electrode 7 and the connection electrode 13 to cover the entirety of the substrate 1. A gate pad via hole is provided at the gate pad region on the substrate, and a data pad via hole is provided at the data pad region. The gate electrode 2, the active layer, the source electrode 6, the drain electrode 7 and the connection electrode 13 constitute the thin film transistor.

FIG. 4 to FIG. 21 are schematic views showing the manufacture process of the first embodiment of the TFT-LCD array substrate according to the invention. Hereinafter, the patterning process described in the invention may comprise the processes of applying photoresist, exposing and developing photoresist, etching, removing remaining photoresist and the like. For example, a positive photoresist is used as an example.

Figure 4:
FIG. 4 is a plan view after a first patterning process of the first embodiment of the TFT-LCD array substrate according to the invention.
Figure 4:
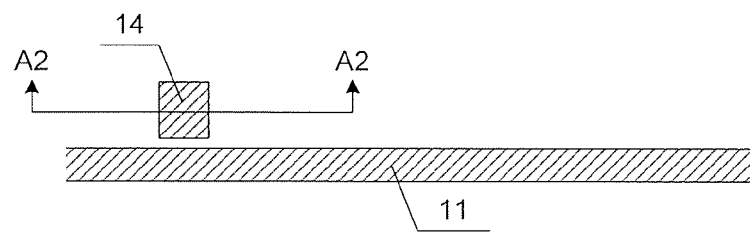
Figure 5:
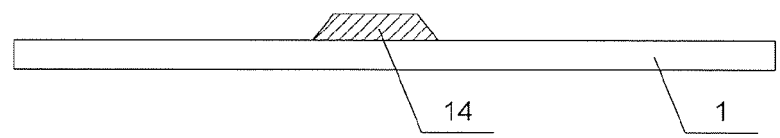
FIG. 5 is a sectional view taken along line A2-A2 in FIG. 4.

FIG. 4 is a plan view after a first patterning process of the first embodiment of the TFT-LCD array substrate according to the invention, in which only one pixel unit is shown. FIG. 5 is a sectional view taken along line A2-A2 in FIG. 4.

A gate metal film with a thickness of 3000-5000 Å is deposited on the substrate 1 (such as a glass substrate or a quartz substrate) by a magnetron sputtering method or a thermal evaporation method. The gate metal film may be formed by a metal such as Cr, W, Ti, Ta, Mo, Al, Cu and the like or an alloy of the above metals. In addition, the gate metal film may have a multi-layer structure formed by any combination of the above metals. The gate line 11 and the blocking layer 14 are formed by a patterning process with a normal mask, and the gate line 11 and the blocking layer 14 are separated from each other, as shown in FIG. 4 and FIG. 5.

Figure 6:
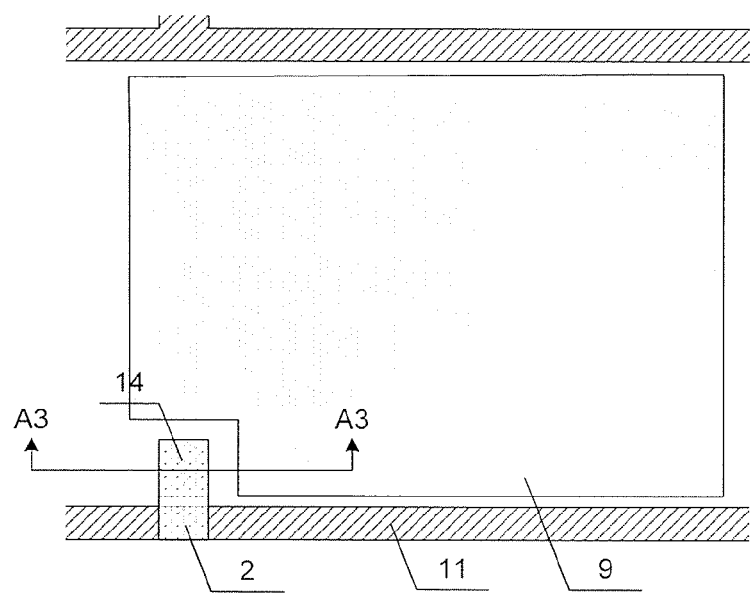
FIG. 6 is a plan view after a second patterning process of the first embodiment of the TFT-LCD array substrate according to the invention.
Figure 7:
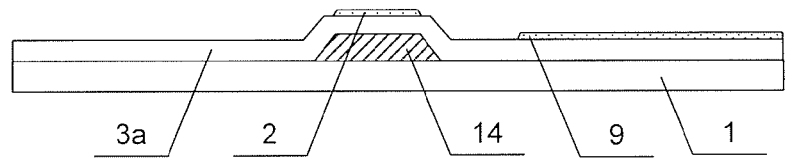
FIG. 7 is a sectional view taken along line A3-A3 in FIG. 6.

FIG. 6 is a plan view after a second patterning process of the first embodiment of the TFT-LCD array substrate according to the invention, in which only one pixel unit is shown. FIG. 7 is a sectional view taken along line A3-A3 in FIG. 6.

On the substrate with the pattern shown in FIG. 4, the first insulating layer 3a with a thickness of 1500-3000 Å is deposited by a plasma enhanced chemical vapor deposition (PECVD) method. The first insulating layer 3a may be formed by an oxide, a nitride or an oxynitride, and the corresponding source gases thereof may be a mixture of $SiH_4$, $NH_3$ and $N_2$ or a mixture of $SiH_2Cl_2$, $NH_3$ and $N_2$. Next, the transparent conductive film with a thickness of 300-600 Å is deposited by a magnetron sputtering method or a thermal evaporation method. The transparent conductive film may be formed by indium tin oxide (ITO), indium zinc oxide (IZO), aluminum zinc oxide (AZO) and the like or by other metals or metal oxides. The gate electrode 2 and the pixel electrode 9 are formed by a patterning process with a normal mask, as shown in FIG. 6 and FIG. 7. The gate electrode 2 is positioned over the blocking layer 14 and extends toward the adjacent gate line 11 so that the gate electrode 2 partially overlaps with the adjacent gate line 11. The pixel electrode 9 is positioned within the pixel region. The first insulating layer 3a in this embodiment may be formed by an organic material in addition to the above inorganic materials. In the case that an organic material is employed, a coating method is used to form the first insulating layer 3a so that the first insulating layer 3a can have a flat surface, which is helpful to form the subsequent structural layers with uniform thickness.

Figure 8:
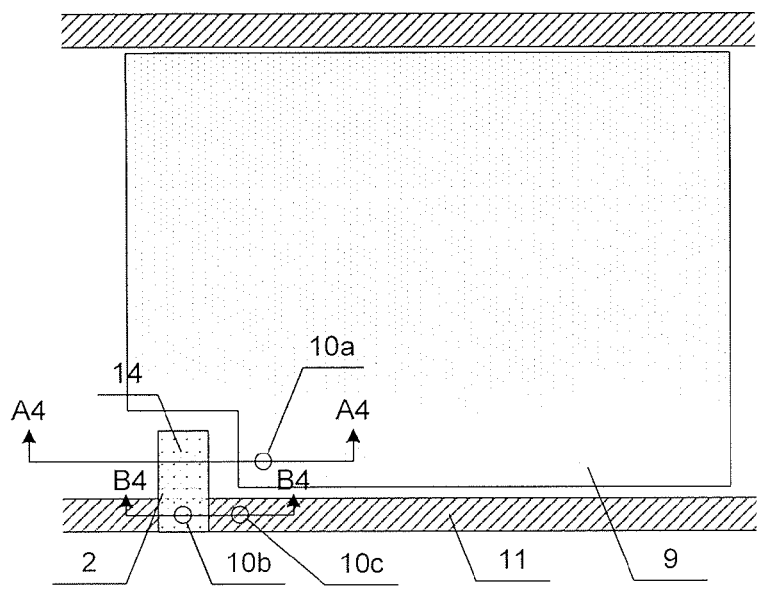
FIG. 8 is a plan view after a third patterning process of the first embodiment of the TFT-LCD array substrate according to the invention.
Figure 9:
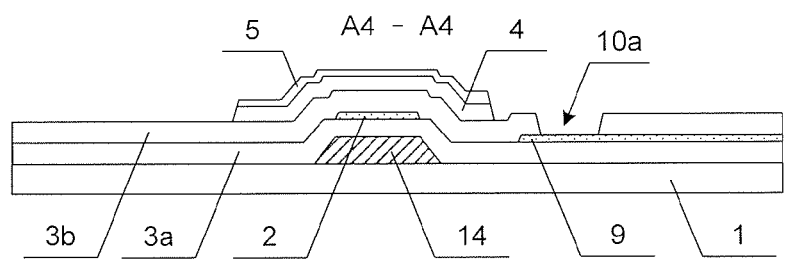
FIG. 9 is a sectional view taken along line A4-A4 in FIG. 9.
Figure 10:
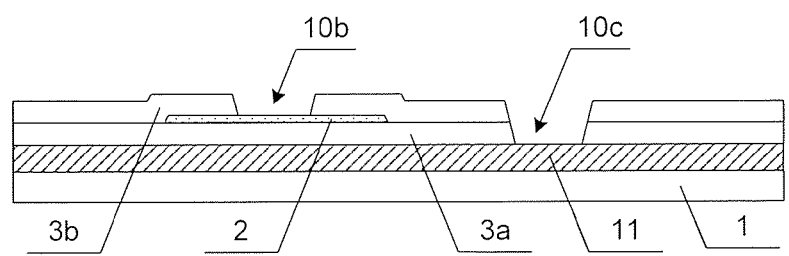
FIG. 10 is a sectional view taken along line B4-B4 in FIG. 8.

On the substrate with the pattern shown in FIG. 6, the second insulating layer 3b with a thickness of 300-1000 Å, a semiconductor film with a thickness of 1000-3000 Å and a doped semiconductor film with a thickness of 1000-3000 Å are deposited by a PECVD method. The second insulating layer 3b may be formed by an oxide, a nitride or an oxynitride, and the corresponding source gases thereof may be a mixture of $SiH_4$, $NH_3$ and $N_2$ or a mixture of $SiH_2Cl_2$, $NH_3$ and $N_2$. The corresponding source gases for the semiconductor film may be a mixture of $SiH_4$ and $H_2$ or a mixture of $SiH_2Cl_2$ and $H_2$, and the corresponding source gases for the doped semiconductor film may be a mixture of $SiH_4$, $PH_3$ and $H_2$ or a mixture of $SiH_2Cl_2$, $PH_3$ and $H_2$. The active layer, the first via hole 10a, the second via hole 10b and the third via hole 10c are formed by a patterning process with a half-tone mask or a gray-tone mask, as shown in FIG. 8 to FIG. 10. The active layer is formed by the stack of the semiconductor layer 4 and the dope semiconductor layer 5 and positioned on the gate electrode 2. The first via hole 10a is positioned at the pixel electrode 9 and near the gate electrode 2. The second via hole 10b is positioned at the gate electrode 2. The third via hole 10c is positioned at the gate line 11. This patterning process will be described in detail as follows.

Figure 11:
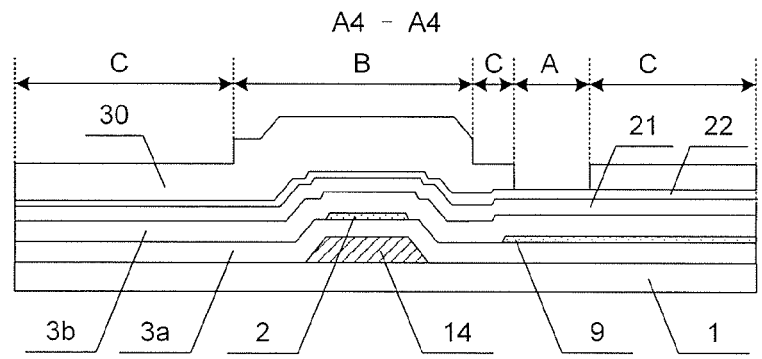
FIG. 11 is a sectional view taken along line A4-A4 after exposing and developing the photoresist in the third patterning process of the first embodiment of the TFT-LCD array substrate according to the invention.
Figure 12:
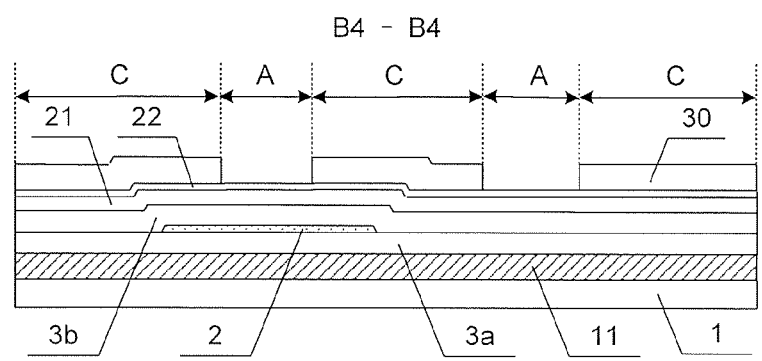
FIG. 12 is a sectional view taken along line B4-B4 after exposing and developing the photoresist in the third patterning process of the first embodiment of the TFT-LCD array substrate according to the invention.

FIG. 11 is a sectional view taken along line A4-A4 after exposing and developing the photoresist in the third patterning process of the first embodiment of the TFT-LCD array substrate according to the invention, and FIG. 12 is a sectional view taken along line B4-B4 after exposing and developing the photoresist in the third patterning process of the first embodiment of the TFT-LCD array substrate according to the invention.

On the substrate with the pattern shown in FIG. 6, the second insulating layer 3b, the semiconductor film 21 and the doped semiconductor film 22 are deposited sequentially by a PECVD method. A photoresist layer 30 is applied on the doped semiconductor film 22 then. The photoresist layer 30 is exposed by using a half-tone mask or a gray-tone mask to form a completely exposed region A, an unexposed region B and a partially exposed region C. The completely exposed region A corresponds to the regions of the first via hole, the second via hole and the third via hole, the unexposed region B corresponds to the region of the active layer, and the partially exposed region C corresponds to the region other than the above regions. After a developing process is performed, the thickness of the photoresist in the unexposed region B substantially is not changed to form a photoresist-completely-retained region, the photoresist in the completely exposed region A is completely removed to form a photoresist-completely-removed region, and the thickness of the photoresist in the partially exposed region C is decreased to form a photoresist-partially-retained region, as shown in FIG. 11 and FIG. 12.

Figure 13:
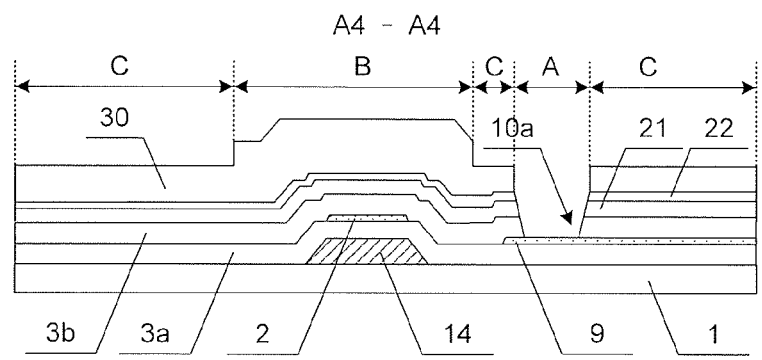
FIG. 13 is a sectional view taken along line A4-A4 after a first etching process in the third patterning process of the first embodiment of the TFT-LCD array substrate according to the invention.
Figure 14:
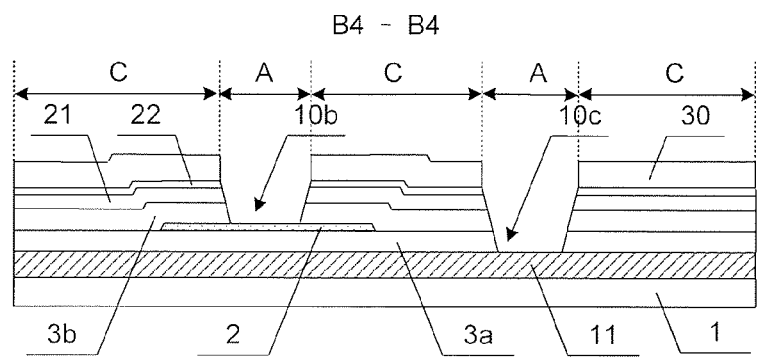
FIG. 14 is a sectional view taken along line B4-B4 after a first etching process in the third patterning process of the first embodiment of the TFT-LCD array substrate according to the invention.

FIG. 13 is a sectional view taken along line A4-A4 after a first etching process in the third patterning process of the first embodiment of the TFT-LCD array substrate according to the invention, and FIG. 14 is a sectional view taken along line B4-B4 after a first etching process in the third patterning process of the first embodiment of the TFT-LCD array substrate according to the invention.

By the first etching process, the doped semiconductor film 22, the semiconductor film 21 and the second insulating layer 3b at the position for forming the first via hole and the second via hole in the completely exposed region A are etched away to form the first via hole 10a and the second via hole 10b. The doped semiconductor film 22, the semiconductor film 21 and the second insulating layer 3b in both of the first via hole 10a and the second via hole 10b are etched away so that the pixel electrode 9 is exposed in the first via hole 10a and the gate electrode 2 is exposed in the second via hole 10b, as shown in FIG. 13 and FIG. 14. In addition, by the first etching process, the doped semiconductor film 22, the semiconductor film 21, the second insulating layer 3b and the first insulating layer 3a at the position for forming the third via hole in the completely exposed region A are etched away to form the third via hole 10c. The doped semiconductor film 22, the semiconductor film 21, the second insulating layer 3b and the first insulating layer 3a in the third via hole 3c are etched away so that the gate line 11 is exposed in the third via hole 10c, as shown in FIG. 14.

Figure 15:
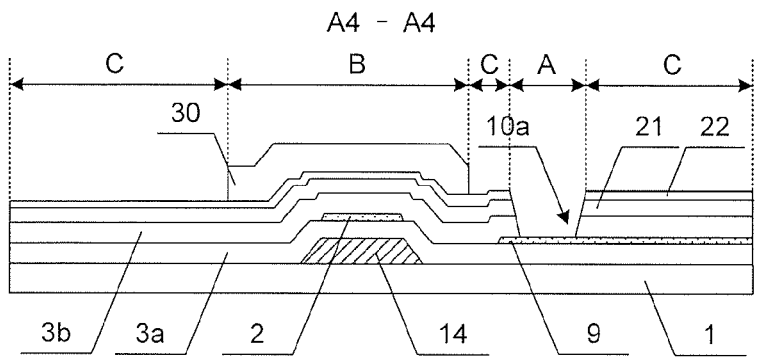
FIG. 15 is a sectional view taken along line A4-A4 after an ashing process in the third patterning process of the first embodiment of the TFT-LCD array substrate according to the invention.
Figure 16:
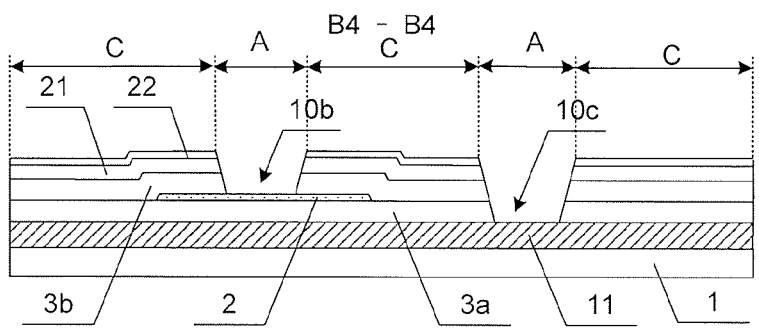
FIG. 16 is a sectional view taken along line B4-B4 after an ashing process in the third patterning process of the first embodiment of the TFT-LCD array substrate according to the invention.

FIG. 15 is a sectional view taken along line A4-A4 after an ashing process in the third patterning process of the first embodiment of the TFT-LCD array substrate according to the invention, and FIG. 16 is a sectional view taken along line B4-B4 after an ashing process in the third patterning process of the first embodiment of the TFT-LCD array substrate according to the invention. By the ashing process, the photoresist in the partially exposed region C is removed so that the doped semiconductor film in this region is exposed, as shown in FIG. 15 and FIG. 16. Since the thickness of the photoresist in the unexposed region B (the photoresist-completely-retained region) is larger than that in the partially exposed region C (the photoresist-partially-retained region), the unexposed region B is still covered by photoresist with a certain thickness after the ashing process.

Figure 17:
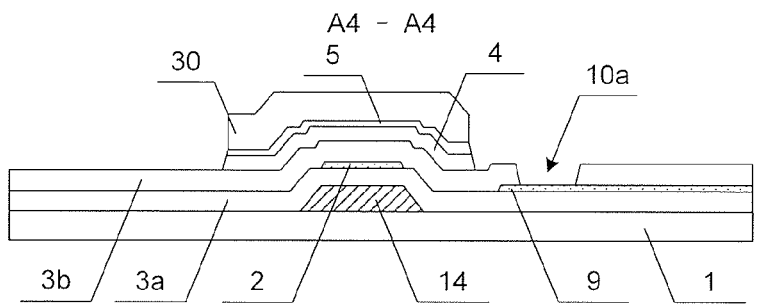
FIG. 17 is a sectional view taken along line A4-A4 after a second etching process in the third patterning process of the first embodiment of the TFT-LCD array substrate according to the invention.
Figure 18:
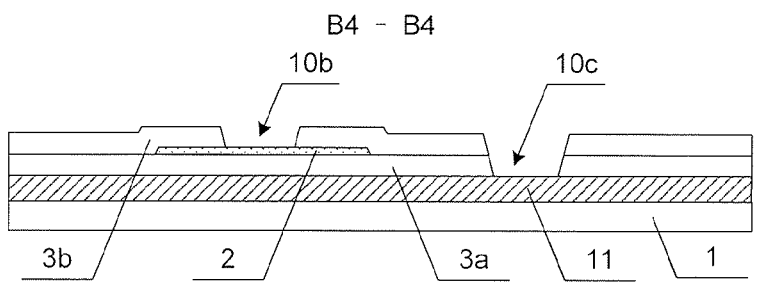
FIG. 18 is a sectional view taken along line B4-B4 after a second etching process in the third patterning process of the first embodiment of the TFT-LCD array substrate according to the invention.

FIG. 17 is a sectional view taken along line A4-A4 after a second etching process in the third patterning process of the first embodiment of the TFT-LCD array substrate according to the invention, and FIG. 18 is a sectional view taken along line B4-B4 after a second etching process in the third patterning process of the first embodiment of the TFT-LCD array substrate according to the invention. By the second etching process, the doped semiconductor film 22 and the semiconductor film 21 in the partially exposed region C are etched away to form the active layer, as shown in FIG. 17 and FIG. 18. The active layer comprises the semiconductor layer 4 and the doped semiconductor layer 5, and is positioned on the gate electrode 2.

Then, the remaining photoresist is removed to complete the third patterning process in this embodiment, as shown in FIG. 8 to FIG. 10.

Figure 19:
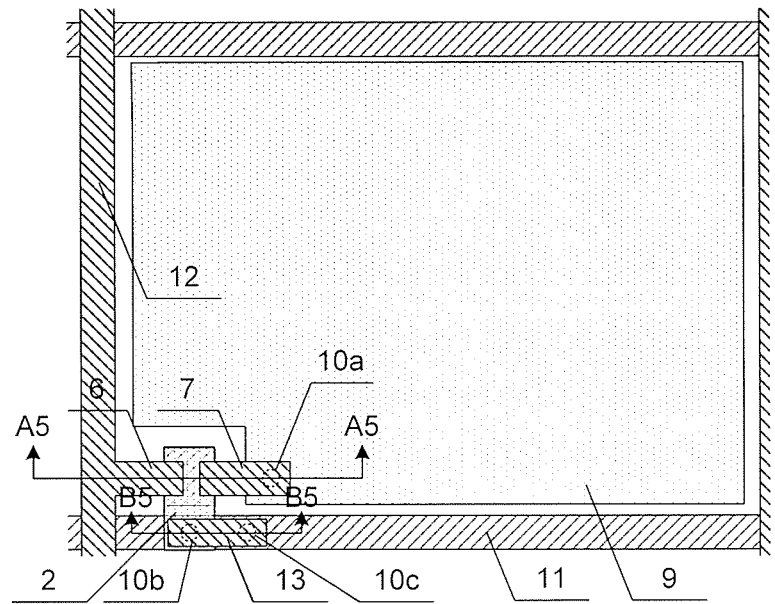
FIG. 19 is a plan view after a fourth patterning process of the first embodiment of the TFT-LCD array substrate according to the invention.
Figure 20:
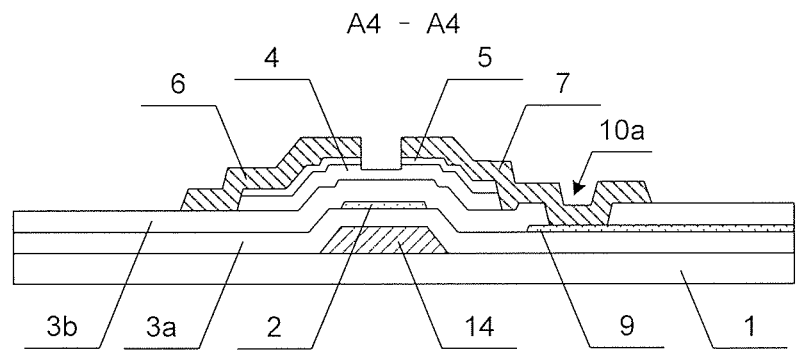
FIG. 20 is a sectional view taken along line A5-A5 in FIG. 19.
Figure 21:
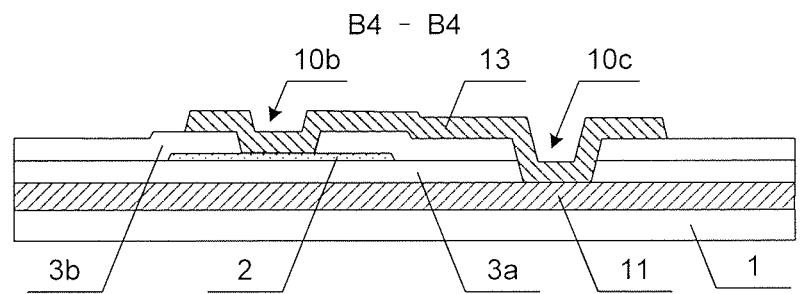
FIG. 21 is a sectional view taken along line B5-B5 in FIG. 19.

FIG. 19 is a plan view after a fourth patterning process of the first embodiment of the TFT-LCD array substrate according to the invention, FIG. 20 is a sectional view taken along line A5-A5 in FIG. 19 and FIG. 21 is a sectional view taken along line B5-B5 in FIG. 19.

On the substrate with the pattern shown in FIG. 8, a source/drain metal film with a thickness of 2000-4000 Å is deposited by a magnetron sputtering method or a thermal evaporation method. The source/drain metal film may be formed by a metal such as Cr, W, Ti, Ta, Mo, Al, Cu and the like or an alloy of the above metals. In addition, the source/drain metal film may have a multi-layer structure formed by any combination of the above metals. The data line 12, the source electrode 6, the drain electrode 7 and the connection electrode 13 are formed by a patterning process with a normal mask, as shown in FIG. 19 to FIG. 21. One end of the source electrode 6 is positioned on the active layer, and the other end thereof is connected with the data line 12. One end of the drain electrode 7 is positioned on the active layer, and the other end thereof is connected with the pixel electrode 9 through the first via hole 10a. The TFT channel region is formed between the source electrode 6 and the drain electrode 7. In the TFT channel region, the doped semiconductor layer 5 is etched away and the semiconductor layer 4 is partially etched in the thickness direction thereof so that the semiconductor layer 4 is exposed. One end of the connection electrode 13 is positioned over the gate electrode 2 and connected with the gate electrode 2 through the second via hole 10b, and the other end thereof is positioned over the gate line 11 and connected with the gate line 11 through the third via hole 10c, thus the gate electrode 2 and the gate line 11 are connected with each other through the connection electrode 13.

Finally, on the substrate with the pattern shown in FIG. 19, the third insulating layer 8 is deposited by a PECVD method (as shown in FIGS. 2 and 3). The third insulating layer 8 may be formed by an oxide, a nitride or an oxynitride, and the corresponding source gases thereof may be a mixture of $SiH_4$, $NH_3$ and $N_2$ or a mixture of $SiH_2Cl_2$, $NH_3$ and $N_2$. The gate pad via hole in the gate pad region and the data pad via hole in the data pad region are formed by a patterning process with a normal mask. The manufacture process of the gate pad via hole and the data pad via hole is well-known to those skilled in the art, and detailed descriptions thereof are omitted here for simplicity.

The above-described manufacture process comprising four patterning processes is only an example for manufacturing the TFT-LCD array substrate in this embodiment, and the TFT-LCD array substrate in the embodiment can be manufactured by increasing the number of the patterning process and selecting different materials or material combinations. For example, the patterns formed in the third patterning process in this embodiment may be formed by two patterning processes, that is, the active layer is formed by one patterning process with a normal mask, and the first via hole, the second via hole and the third via hole are formed in the other patterning process with another normal mask. In addition, the gate electrode in this embodiment may be formed by other conductive films with a small thickness. In this case, the patterns formed in the second patterning process in this embodiment may be formed by two patterning processes, that is, the gate electrode is formed by one patterning process and the pixel electrode is formed by the other patterning process. When the gate electrode is formed by an opaque conductive film such as a metal film, the blocking layer formed in the first patterning process may be omitted.

When the gate electrode is formed by a metal film, the thickness of the metal film is 300-1200 Å and preferably 400-600 Å, to form the gate electrode with a small thickness. In this case, the gate electrode and the pixel electrode may be formed by two separate patterning processes as described above. In addition, the gate electrode and the pixel electrode may be formed by patterning the transparent conductive film and the metal film, which are sequentially formed, with a half-tone or gray-tone mask; in this case, the transparent conductive film is remained below the gate electrode formed of the metal film, and the detailed description of the patterning process is omitted for simplicity.

Figure 22:
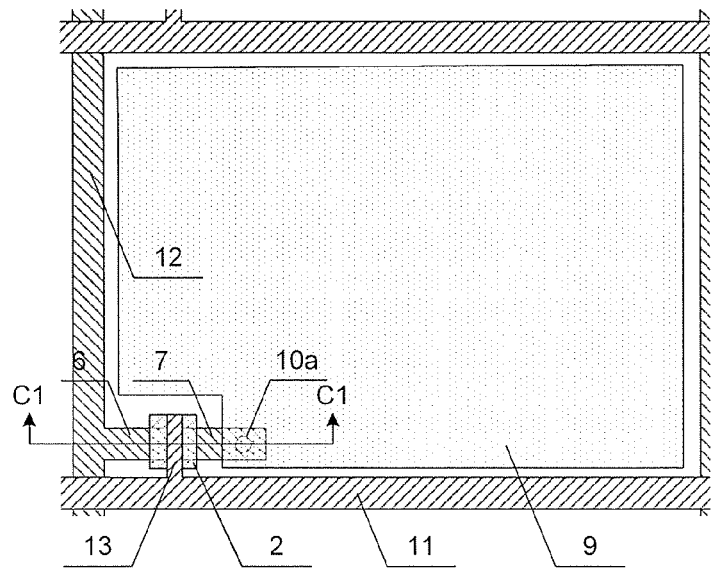
FIG. 22 is a plan view showing a second embodiment of a TFT-LCD array substrate according to the invention.
Figure 23:
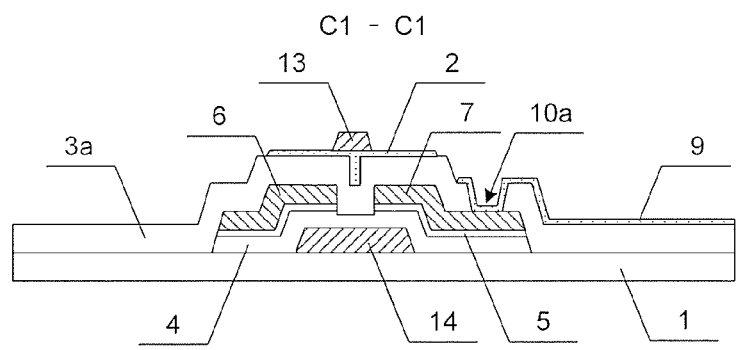
FIG. 23 is a sectional view taken along line C1-C1 in FIG. 22.

FIG. 22 is a plan view showing a second embodiment of a TFT-LCD array substrate according to the invention, in which only one pixel unit is shown. FIG. 23 is a sectional view taken along line C1-C1 in FIG. 22.

As shown in FIGS. 22 and 23, the TFT-LCD array substrate in this embodiment is in a top gate configuration and comprises a plurality of gate lines 11, a plurality of data lines 12, a plurality of pixel electrodes 9 and a plurality of thin film transistors, which are all formed on a substrate 1. The thin film transistor is a top gate type transistor. A plurality of pixel regions are defined by intersecting the gate lines 11 and the data lines 12 perpendicular to each other. In each of the pixel regions, one thin film transistor serving as switch element and one pixel electrode 9 are provided. The gate lines 11 are used to supply the turn-on signals to the thin film transistors, and the data lines 12 are used to supply the data signals to the pixel electrodes 9. The gate electrodes of the thin film transistors are formed by a transparent conductive film with a small thickness. For example, the thickness of the transparent conductive film is 300-600 Å. Because the gate electrodes are formed by the transparent conductive film and the transparent conductive film has a small thickness (such as 300-600 Å) as described above, both the variation of the inclination angles of side surface among the gate electrodes and the areas occupied the gate electrode side surfaces can be decreased, thus the influence of the inclination angle of side surface of each gate electrode on the overlapping area between the gate electrode and the corresponding drain electrode can be decreased. Therefore, the variation of the parasitic capacitance of the thin film transistors at different positions over the array substrate can be decreased, and accordingly the variation of the kickback voltages $\Delta V_p$ among the thin film transistors can also be decreased.

Specifically, the TFT-LCD array substrate in this embodiment comprises a blocking layer 14 on the substrate 1. An active layer (for example, comprising a semiconductor layer 4 and a doped semiconductor layer 5 stacked together) is formed on the blocking layer 4. A source electrode 6 and a drain electrode 7 are formed on the active layer. One end of the source electrode 6 is positioned over the blocking layer 14, and the other end thereof is connected with the data line 12. One end of the drain electrode 7 is positioned over the blocking layer 14 and opposites to the source electrode 6. A TFT channel region is formed between the source electrode 6 and the drain electrode 7. In the TFT channel region, the doped semiconductor layer 5 is etched away and the semiconductor layer 4 is partially etched in the thickness direction thereof so that the semiconductor layer 4 is exposed. A first insulating layer 3a is formed on the above patterns to cover the entirety of the substrate 1. In the first insulating layer 3a, a first via hole 10a is formed at the drain electrode 7. The gate electrode 2, the pixel electrode 9, the gate line 11 and a connection electrode 13 are formed on the first insulating layer 3a. The pixel electrode 9 is formed within one pixel region and connected with the drain electrode 7 through the first via hole 10a. The gate electrode 2 formed by the transparent conductive film is positioned over the blocking layer 14. One end of the connection electrode 13 is provided on and contacts the gate electrode 2 and the other end thereof is connected with the gate line 11, so that the gate electrode 2 and the gate line 11 are connected with each other through the connection electrode 13. The gate electrode 2, the active layer, the source electrode 6, the drain electrode 7 and the connection electrode 13 constitute the thin film transistor.

FIG. 24 to FIG. 33 are schematic views showing the manufacture process of the second embodiment of the TFT-LCD array substrate according to the invention. The materials for forming the structural layers in this embodiment are same as those in the first embodiment.

Figure 24:
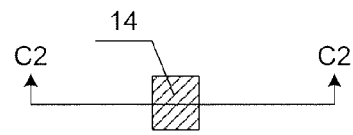
FIG. 24 is a plan view after a first patterning process of the second embodiment of the TFT-LCD array substrate according to the invention.
Figure 25:
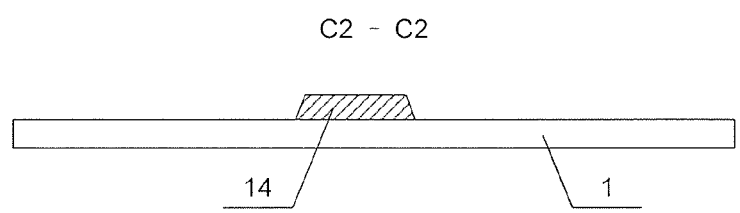
FIG. 25 is a sectional view taken along line C2-C2 in FIG. 24.

FIG. 24 is a plan view after a first patterning process of the second embodiment of the TFT-LCD array substrate according to the invention, in which only one pixel unit is shown. FIG. 25 is a sectional view taken along line C2-C2 in FIG. 24.

Firstly, a light-blocking metal film with a thickness of 500-2000 Å is deposited on the substrate 1 by a magnetron sputtering method or a thermal evaporation method. The light-blocking metal film is formed by a metal capable of blocking light (such as Cr). The light-blocking layer 14 is formed by a patterning process with a normal mask, as shown in FIG. 24 and FIG. 25. In addition, the light-blocking layer 14 may be formed by non-metal materials capable of blocking light, such as resins mixed with black particles.

Figure 26:
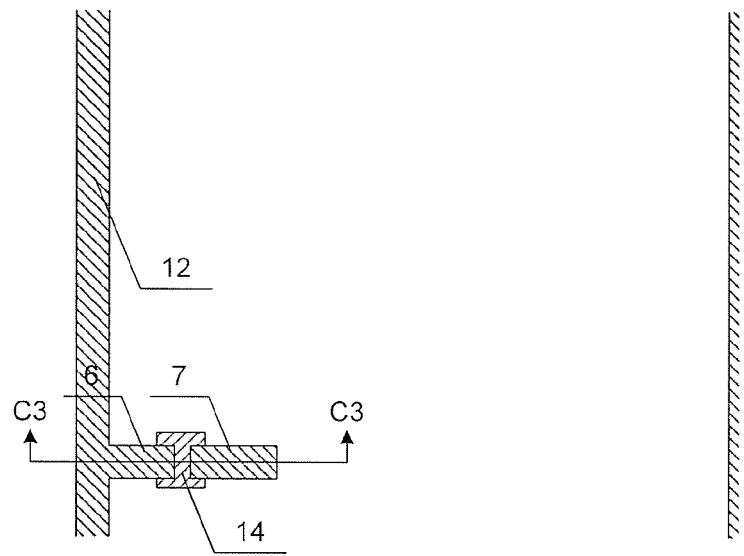
FIG. 26 is a plan view after a second patterning process of the second embodiment of the TFT-LCD array substrate according to the invention.
Figure 27:
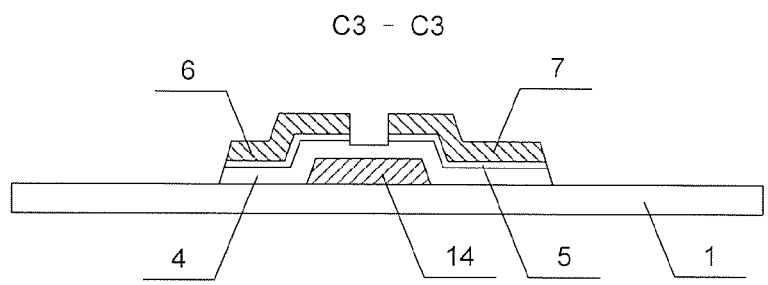
FIG. 27 is a sectional view taken along line C3-C3 in FIG. 26.

FIG. 26 is a plan view after a second patterning process of the second embodiment of the TFT-LCD array substrate according to the invention, in which only one pixel unit is shown. FIG. 27 is a sectional view taken along line C3-C3 in FIG. 26.

On the substrate with the pattern shown in FIG. 24, a semiconductor film with a thickness of 1000-3000 Å and a doped semiconductor film with a thickness of 1000-3000 Å are sequentially deposited by a PECVD method, and then a source/drain metal film with a thickness of 2000-4000 Å is deposited by a magnetron sputtering method or a thermal evaporation method. The active layer, the data line 12, the source electrode 6, the drain electrode and the TFT channel region are formed by a patterning process with a half-tone mask or a gray-tone mask, as shown in FIG. 26 and FIG. 27. This patterning process is a multi-step etching process and similar to that for forming the active layer, the data line, the source electrode, the drain electrode and the TFT channel region in the conventional technology comprising four patterning processes. This patterning process is performed as follows.

The semiconductor film and the doped semiconductor film are firstly deposited, and then the source/drain metal film is deposited. A photoresist layer is deposited on the source/drain metal film. Then, an exposing process is performed by using a half-tone mask or a gray-tone mask to form a completely exposed region, an unexposed region and a partially exposed region. The unexposed region corresponds to the regions of the data line, the source electrode and the drain electrode. The partially exposed region corresponds to the region of the TFT channel region, and the completely exposed region corresponds to the region other than the above regions. After a developing process is performed, the thickness of the photoresist in the unexposed region substantially is not changed to form a photoresist-completely-retained region, the photoresist in the completely exposed region is completely removed to form a photoresist-completely-removed region, and the thickness of the photoresist in the partially exposed region is decreased to form a photoresist-partially-retained region. By a first etching process, the source/drain metal film, the doped semiconductor film and the semiconductor film in the photoresist-completely-removed region is etched away to form the active layer and the data line. By an ashing process, the photoresist in the photoresist-partially-retained region is removed to expose the source/drain metal film in this region, and the photoresist in the photoresist-completely-retained region is partially retained and reduced in thickness. By a second etching process, the source/drain metal film and the doped semiconductor film in the photoresist-partially-retained region are etched away and the semiconductor film in this region is partially etched in the thickness direction so that the source electrode, the drain electrode and the TFT channel region are formed. Then, the remaining photoresist is removed to complete this patterning process. After this patterning process, the active layer (comprising the stack of the semiconductor layer 4 and the doped semiconductor layer 5) is positioned on the blocking layer 14, and the source electrode 6 and the drain electrode 7 are formed on the active layer. One end of the source electrode 6 is positioned over the blocking layer 14, and the other end thereof is connected with the data line 12. One end of the drain electrode 7 is positioned over the blocking layer 14 and opposites to the source electrode 6. The TFT channel region is formed between the source electrode 6 and the drain electrode 7. In the TFT channel region, the doped semiconductor layer 5 is etched away and the semiconductor layer 4 is partially etched in the thickness direction thereof so that the semiconductor layer 4 is exposed.

Figure 28:
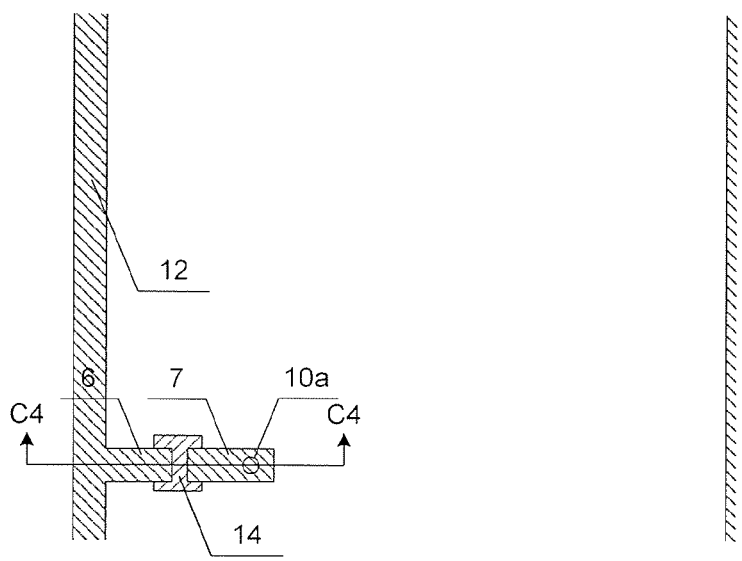
FIG. 28 is a plan view after a third patterning process of the second embodiment of the TFT-LCD array substrate according to the invention.
Figure 29:
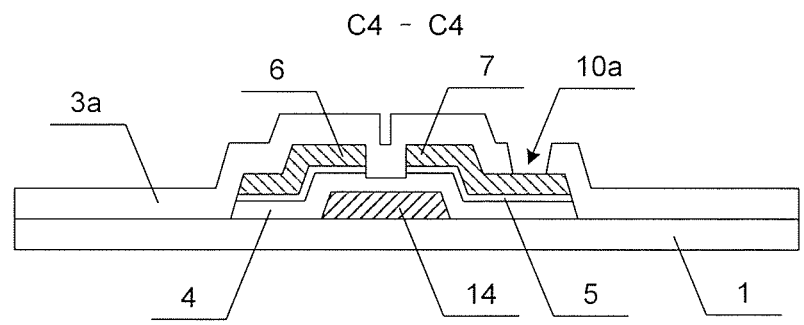
FIG. 29 is a sectional view taken along line C4-C4 in FIG. 28.

FIG. 28 is a plan view after a third patterning process of the second embodiment of the TFT-LCD array substrate according to the invention, in which only one pixel unit is shown. FIG. 29 is a sectional view taken along line C4-C4 in FIG. 28.

On the substrate with the pattern shown in FIG. 26, the first insulating layer 3a with a thickness of 3000-5000 Å is deposited by a PECVD method. The first via hole 10a is formed by a patterning process with a normal mask, as shown in FIG. 28 and FIG. 29. The first via hole 10a is positioned at the drain electrode 7. The first insulating layer 3a in the first via hole 10a is etched away to expose the drain electrode 7.

Then, on the substrate with the pattern shown in FIG. 28, the transparent conductive film with a thickness of 300-600 Å and the gate metal film with a thickness of 500-4000 Å are deposited by a magnetron sputtering method or a thermal evaporation method. The gate electrode 2, the pixel electrode 9, the gate line 11 and the connection electrode 13 are formed by a patterning process with a half-tone or gray-tone mask. This patterning process will be described in detail as follows.

Figure 30:
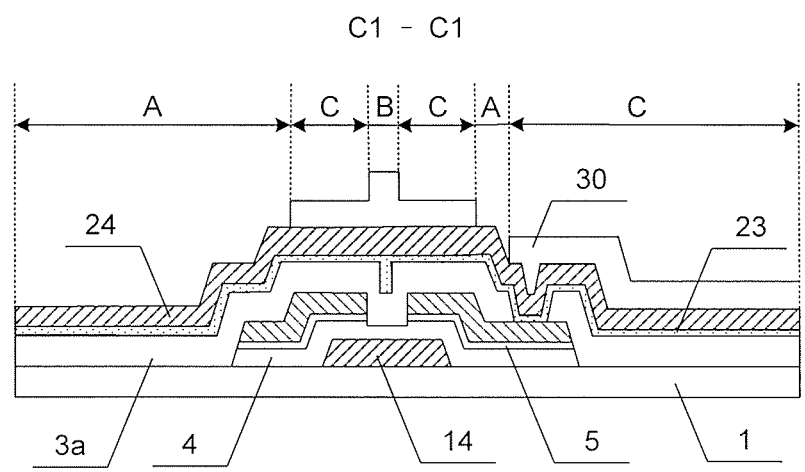
FIG. 30 is a structural diagram after exposing and developing the photoresist in the fourth patterning process of the second embodiment of the TFT-LCD array substrate according to the invention.

FIG. 30 is a structural diagram after exposing and developing the photoresist in the fourth patterning process of the second embodiment of the TFT-LCD array substrate according to the invention, which is a sectional view taken along line C1-C1 in FIG. 22.

On the substrate with the pattern shown in FIG. 28, the transparent conductive film 23 and the gate metal film 24 are sequentially deposited by a magnetron sputtering method or a thermal evaporation method. A photoresist layer 30 is applied on the gate metal film 24. The photoresist layer 30 is exposed by using a half-tone mask or a gray-tone mask to form a completely exposed region A, an unexposed region B and a partially exposed region C. The unexposed region B corresponds to the regions of the gate line and the connection electrode, the partially exposed region C corresponds to the regions of the gate electrode and the pixel electrode, and the completely exposed region A corresponds to the region other than the above regions. After a developing process is performed, the thickness of the photoresist in the unexposed region B substantially is not changed to form a photoresist-completely-retained region, the photoresist in the completely exposed region A is completely removed to form a photoresist-completely-removed region, and the thickness of the photoresist in the partially exposed region C is decreased to form a photoresist-partially-retained region, as shown in FIG. 30.

Figure 31:
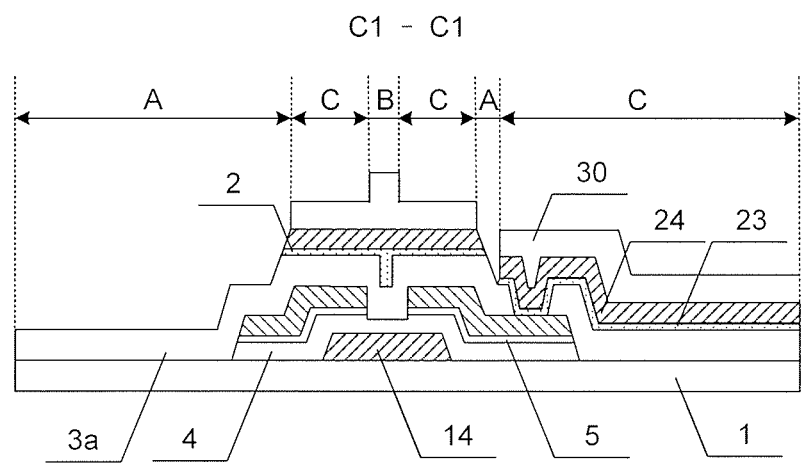
FIG. 31 is a structural diagram after a first etching process in the fourth patterning process of the second embodiment of the TFT-LCD array substrate according to the invention.

FIG. 31 is a structural diagram after a first etching process in the fourth patterning process of the second embodiment of the TFT-LCD array substrate according to the invention, which is a sectional view taken along line C1-C1 in FIG. 22. By the first etching process, the gate metal film 24 and the transparent conductive film 23 in the completely exposed region A is etched away to form the gate line 11 as shown in FIG. 31. In this process, the data pad via hole can be formed in the data pad region.

Figure 32:
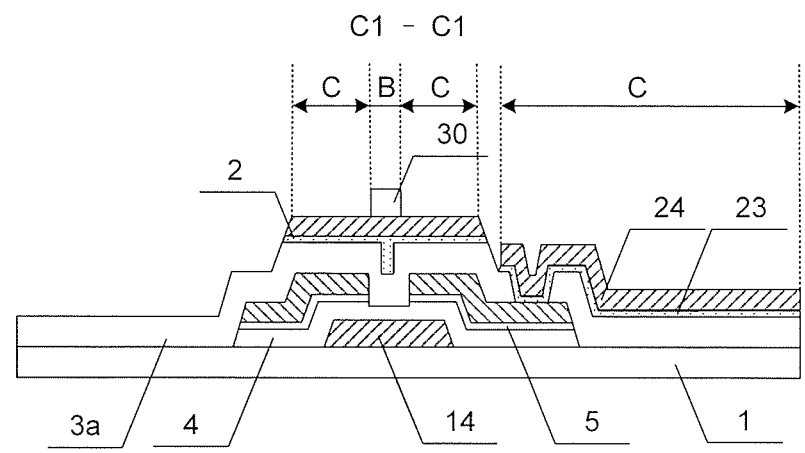
FIG. 32 is a structural diagram after an ashing process in the fourth patterning process of the second embodiment of the TFT-LCD array substrate according to the invention.

FIG. 32 is a structural diagram after an ashing process in the fourth patterning process of the second embodiment of the TFT-LCD array substrate according to the invention, which is a sectional view taken along line C1-C1 in FIG. 22. By the ashing process, the photoresist in the partially exposed region C is removed to expose the gate metal film 24 in this region, as shown in FIG. 32. Since the thickness of the photoresist in the unexposed region B (the photoresist-completely-retained region) is larger than that in the partially exposed region C (the photoresist-partially-retained region), the unexposed region B is still covered by photoresist with a certain thickness after the ashing process.

Figure 33:
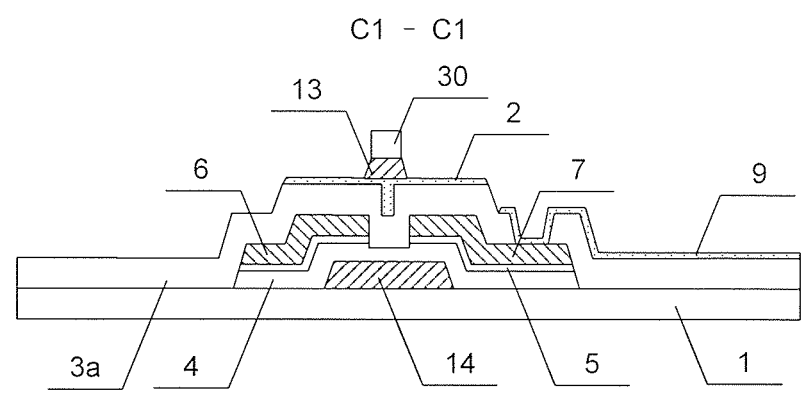
FIG. 33 is a structural diagram after a second etching process in the fourth patterning process of the second embodiment of the TFT-LCD array substrate according to the invention.

FIG. 33 is a structural diagram after a second etching process in the fourth patterning process of the second embodiment of the TFT-LCD array substrate according to the invention, which is a sectional view taken along line C1-C1 in FIG. 22.

By the second etching process, the gate metal film in the partially exposed region C is etched away to form the gate electrode 2, the pixel electrode 9 and the connection electrode 13, as shown in FIG. 33. The gate electrode 2 formed by the transparent conductive film is positioned over the blocking layer 14. The pixel electrode 9 is formed within the pixel region and connected with the drain electrode 7 through the first via hole 10a. The connection electrode 13 is positioned on the gate electrode 2 so that the gate electrode 2 is connected with the gate line 11 through the connection electrode 13. The connection electrode 13 is formed by the gate metal film with a large thickness. Since the connection electrode 13 is only used to connect the gate line and the gate electrode, the connection electrode 13 is provided at the central portion of the gate electrode and the width of the connection electrode 13 is smaller than that of the gate electrode. Preferably, the width of the connection electrode is smaller than that of the TFT channel region so that the connection electrode is provided outside the overlapping region of the drain electrode and the gate electrode, thus the connection electrode does not influence the parasitic capacitance.

Then, the remaining photoresist is removed to complete the fourth patterning process of the second embodiment of the TFT-LCD array substrate, as shown in FIG. 22 and FIG. 23.

The above described manufacture process comprising four patterning processes is only an example for manufacturing the TFT-LCD array substrate in this embodiment, and the TFT-LCD array substrate in the embodiment can be manufactured by increasing the number of the patterning process and selecting different materials or material combinations. For example, the patterns formed in the second patterning process in this embodiment may be formed by two patterning processes, that is, the active layer is formed by one patterning process with a normal mask, and the data line, the source electrode and the drain electrode are formed in the other patterning process with another normal mask. In addition, the patterns formed in the fourth patterning process in this embodiment also may be formed by two patterning processes, that is, the gate electrode and the pixel electrode are formed by one patterning process with a normal mask, and the gate line and the connection electrode are formed by the other patterning process with another normal mask.

According to the above embodiments of the TFT-LCD array substrate in the invention, the gate electrode is formed by the transparent conductive film and the transparent conductive film has a small thickness, thus both the variation of the inclination angles of side surface of the gate electrodes and the areas occupied by the gate electrode side surfaces can be decreased, and accordingly the influence of the inclination angles of side surface of each gate electrode on the overlapping area between the gate electrode and the corresponding drain electrode can be decreased. Therefore, the variation of the parasitic capacitance among the thin film transistors at different positions over the array substrate can be decreased, and the variation of the kickback voltages $\Delta V_p$ among the thin film transistors can also be decreased. Therefore, the flickers caused by the variation of the kickback voltages $\Delta V_p$ can be suppressed, and thus the display quality of the TFT-LCD can be improved.

A first embodiment of a method of manufacturing a TFT-LCD array substrate according to the invention may comprise the following steps.

Step 11, depositing a gate metal film on a substrate and forming a gate line and a blocking layer by a patterning process;

Step 12, depositing a first insulating layer and a transparent conductive film on the substrate after the Step 11, and forming a gate electrode and a pixel electrode by a patterning process, wherein the gate electrode formed by the transparent conductive film is positioned over the blocking layer;

Step 13, depositing a second insulating layer, a semiconductor film and a doped semiconductor film on the substrate after the Step 12, and forming an active layer, a first via hole, a second via hole and a third via hole by a patterning process, wherein the active layer comprises a semiconductor layer and a doped semiconductor layer stacked together and is positioned on the gate electrode, the first via hole is positioned at the pixel electrode, the second via hole is positioned at the gate electrode and the third via hole is positioned at the gate line;

Step 14, depositing a source/drain metal film on the substrate after the Step 13, and forming a data line, a drain electrode, a source electrode and a connection electrode by a patterning process, wherein one end of the source electrode is positioned on the active layer and the other end thereof is connected with the data line, one end of the drain electrode is positioned on the active layer and the other end thereof is connected with the pixel electrode through the first via hole, one end of the connection electrode is connected with the gate electrode through the second via hole and the other end thereof is connected with the gate line through the third via hole; and Step 15, depositing a third insulating layer on the substrate after the Step 14, and forming a gate pad via hole in a gate pad region and a data pad via hole in a data pad region by a patterning process.

According to this embodiment, an example of the Step 13 may comprise the following steps.

Step 131, sequentially depositing the second insulating layer, the semiconductor film and the doped semiconductor film by a PECVD method;

Step 132, applying a photoresist layer on the doped semiconductor film;

Step 133, exposing the photoresist layer by using a half-tone mask or a gray-tone mask and developing the exposed photoresist layer to form a photoresist-completely-removed region, a photoresist-completely-retained region, and a photoresist-partially-retained region, wherein the photoresist-completely-removed region corresponds to the regions of the first via hole, the second via hole and the third via hole, the photoresist-completely-retained region corresponds to the region of the active layer, and the photoresist-partially-retained region corresponds to the region other than the above regions, and wherein the thickness of the photoresist in the photoresist-completely-retained region is not changed, the photoresist in the photoresist-completely-removed region is completely removed, and the thickness of the photoresist in photoresist-partially-retained region is decreased;

Step 134, forming the first via hole, the second via hole and the third via hole by a first etching process, wherein the first via hole is positioned at the pixel electrode, the second via hole is positioned at the gate electrode and the third via hole is positioned at the gate line;

Step 135, removing the photoresist in the photoreisit-partially-removed region by an aching process to expose the doped semiconductor film in this region and retaining the photoresist in the photoreisit-completely-removed region;

Step 136, etching away the doped semiconductor film and the semiconductor film exposed in the photoresist-partially-retained region by a second etching process to form the active layer, wherein the active layer comprises the semiconductor layer and the doped semiconductor layer and is positioned on the gate electrode; and Step 137, removing the remaining photoresist.

In an example, in the Step 134, by the first etching process, the doped semiconductor film, the semiconductor film and the second insulating layer at the positions for forming the first via hole and the second via hole in the photoresist-completely-removed region are etched away to form the first via hole and the second via hole. The doped semiconductor film, the semiconductor film and the second insulating layer in both of the first via hole and the second via hole are etched away so that the pixel electrode is exposed in the first via hole and the gate electrode is exposed in the second via hole. In addition, also by the first etching process, the doped semiconductor film, the semiconductor film, the second insulating layer and the first insulating layer at the position for forming the third via hole in the photoresist-completely-removed region are etched away to form the third via hole. The doped semiconductor film, the semiconductor film, the second insulating layer and the first insulating layer in the third via hole are etched away so that the gate line is exposed in the third via hole.

The thin film transistor employed in the TFT-LCD array substrate manufactured in this embodiment is in the bottom gate type configuration. The manufacture process of the TFT-LCD array substrate according to this embodiment has been described in detail with reference to FIG. 4 to FIG. 21, and the detailed descriptions thereof is omitted here for simplicity.

According to another embodiment, the gate electrode of the bottom gate type transistor is formed by a metal film. When the gate electrode is formed by the metal film, the Step 12 is performed in a different way. Specifically, the transparent conductive film for the pixel electrode and the metal film for the gate electrode are respectively patterned by two separate patterning processes to form the pixel electrode and the gate electrode; or the transparent conductive film and the metal film for the gate electrode are sequentially deposited and then the stack of the transparent conductive film and the metal film for the gate electrode are patterned by using a half-tone mask or a gray-tone mask to form the gate electrode and the pixel electrode.

A second embodiment of the method of manufacturing a TFT-LCD array substrate according to the invention may comprise the following steps.

Step 21, depositing a light-blocking film on a substrate and forming a blocking layer by a patterning process;

Step 22, depositing a semiconductor film, a doped semiconductor film and a source/drain metal film on the substrate after the Step 21, and forming an active layer, a data line, a source electrode and a drain electrode by a patterning process;

Step 23, depositing a first insulating layer on the substrate after the Step 22, and forming a first via hole by a patterning process, wherein the first via hole is positioned at the drain electrode;

Step 24, depositing a transparent conductive film and a gate metal film on the substrate after the Step 23, and forming a gate electrode, a pixel electrode, a gate line and a connection electrode by a patterning process, wherein the pixel electrode is connected with the drain electrode through the first via hole, the gate electrode formed by the transparent conductive film is positioned over the blocking layer, and one end of the connection electrode is provided on and contacts the gate electrode and the other end thereof is connected with the gate line.

According to this embodiment, an example of the Step 21 may comprise the following steps.

Step 211, depositing a light-blocking metal film on the substrate by a magnetron sputtering method or a thermal evaporation method; and Step 212, forming the blocking layer by a patterning process with a normal mask.

According to this embodiment, the example of the Step 22 may comprise the following steps.

Step 221, sequentially depositing the semiconductor film and the doped semiconductor film by a PECVD method;

Step 222, depositing the source/drain metal film by a magnetron sputtering method or a thermal evaporation method;

Step 223, applying a photoresist layer on the source/drain metal film;

Step 224, exposing the photoresist layer by using a half-tone mask or a gray-tone mask and developing the exposed photoresist to form a photoresist-completely-removed region, a photoresist-completely-retained region, and a photoresist-partially-retained region, wherein the photoresist-completely-retained region corresponds to the regions of the data line, the source electrode and the drain electrode, the photoresist-partially-retained region corresponds to the region of a TFT channel region, and the photoresist-completely-removed region corresponds to the region other than the above regions, and wherein the thickness of the photoresist in the photoresist-completely-retained region is not changed, the photoresist in the photoresist-completely-removed region is completely removed, and the thickness of the photoresist in photoresist-partially-retained region is decreased;

Step 225, etching away the source/drain metal film, the doped semiconductor film and the semiconductor film in the photoresist-completely-removed region by a first etching process to form the active layer and the data line;

Step 226, removing the photoresist in the photoresist-partially-retained region by an ashing process to expose the source/drain metal film in this region and retaining the photoresist in the photoresist-completely-retained region;

Step 227, etching away the source/drain metal film and the doped semiconductor film and partially etching the semiconductor film in the thickness direction in the photoresist-partially-retained region by a second etching process to form the source electrode, the drain electrode and the TFT channel region; and Step 228, removing the remaining photoresist.

According to this embodiment, the example of the Step 24 may comprise the following steps.

Step 241, sequentially depositing the transparent conductive film and the gate metal film by a magnetron sputtering method or a thermal evaporation method;

Step 242, applying a photoresist layer on the gate metal film;

Step 243, exposing the photoresist layer by using a half-tone mask or a gray-tone mask and developing the exposed photoresist to form a photoresist-completely-removed region, a photoresist-completely-retained region, and a photoresist-partially-retained region, wherein the photoresist-completely-retained region corresponds to the regions of the gate line and the connection electrode, the photoresist-partially-retained region corresponds to the regions of the gate electrode and the pixel electrode, and the photoresist-completely-removed region corresponds to the region other than the above regions, and wherein the thickness of the photoresist in the photoresist-completely-retained region is not changed, the photoresist in the photoresist-completely-removed region is completely removed, and the thickness of the photoresist in photoresist-partially-retained region is decreased;

Step 244, etching away the gate metal film and the transparent conductive film in the photoresist-completely-removed region by a first etching process to form the gate line;

Step 245, removing the photoresist in the photoresist-partially-retained region by an ashing process to expose the gate metal film in this region and retaining the photoresist in the photoresist-completely-retained region;

Step 246, etching away the gate metal film in the photoresist-partially-retained region by a second etching process to form the gate electrode, the pixel electrode and the connection electrode, wherein the gate electrode formed by the transparent conductive film is positioned over the blocking layer, the pixel electrode is connected with the drain electrode through the first via hole, one end of the connection electrode is provided on and contacts the gate electrode and the other end thereof is connected with the gate line so that the gate electrode is connected with the gate line through the connection electrode; and Step 247, removing the remaining photoresist.

The thin film transistor employed in the TFT-LCD array substrate manufactured in this embodiment is in the top gate type configuration. The manufacture process of the TFT-LCD array substrate according to this embodiment has been described in detail with reference to FIG. 24 to FIG. 33, and the descriptions thereof is omitted here for simplicity.

According to the above embodiments of manufacturing the TFT-LCD array substrate in the invention, the gate electrode is formed by the transparent conductive film and the transparent conductive film has a small thickness, thus both the variation of the inclination angles of side surface of the gate electrodes and the areas occupied by the gate electrode side surface can be decreased, and accordingly the influence of the inclination angles of side surface of each gate electrode on the overlapping area between the gate electrode and the corresponding drain electrode can be decreased. Therefore, the variation of the parasitic capacitance among the thin film transistors at different positions over the array substrate can be decreased, and the variation of the kickback voltages $\Delta V_p$ among the thin film transistors can also be decreased. Therefore, the flickers caused by the variation of the kickback voltages $\Delta V_p$ can be suppressed, and thus the display quality of the TFT-LCD can be improved.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A thin film transistor liquid crystal display (TFT-LCD) array substrate, comprising:
    a plurality of gate lines and a plurality of data lines on a substrate, and
    a plurality of pixel regions defined by the gate lines and the data lines, each of the pixel regions comprising a pixel electrode and a thin film transistor serving as a switch element,
    wherein a gate electrode of the thin film transistor is connected with a corresponding gate line through a connection electrode, and the gate electrode is formed by a material layer different from that forming the gate lines;
    wherein the thin film transistor is a bottom gate type transistor.

2. The TFT-LCD array substrate according to claim 1, wherein a first insulating layer is formed on the gate lines to cover the entirety of the substrate, and the gate electrode and the pixel electrode are formed on the first insulating layer.

3. The TFT-LCD array substrate according to claim 2, wherein a second insulating layer is formed on the gate electrode and the pixel electrode to cover the entirety of the substrate, an active layer of the thin film transistor is formed on the second insulating layer and positioned on the gate electrode; a source electrode of the thin film transistor is positioned on the active layer and connected with corresponding data line, and a drain electrode of the thin film transistor is positioned on the active layer and connected with the pixel electrode through a first via hole in the second insulating layer.

4. The TFT-LCD array substrate according to claim 2, wherein the connection electrode is formed on the second insulating layer, one end of the connection electrode is connected with the gate electrode through a second via hole in the second insulating layer, and the other end thereof is connected with corresponding gate line through a third via hole in the first insulating layer and the second insulating layer.

5. The TFT-LCD array substrate according to claim 1, wherein the gate electrode of the thin film transistor is formed by a transparent conductive film and provided on the same layer as the pixel electrode, and the gate electrode and the pixel electrode are formed by the same transparent conductive film.

6. The TFT-LCD array substrate according to claim 5, wherein the thickness of the transparent conductive film is 300-600 Å.

7. The TFT-LCD array substrate according to claim 5, wherein a blocking layer is formed on the substrate, and the blocking layer is positioned below the gate electrode and provided on the same layer as the gate lines.

8. The TFT-LCD array substrate according to claim 1, wherein the gate electrode of the thin film transistor is formed by a metal film.

9. The TFT-LCD array substrate according to claim 8, wherein the thickness of the metal film is 300-1200 Å.

10. A method of manufacturing a thin film transistor liquid crystal display (TFT-LCD) array substrate, comprising:
    Step 11 of depositing a gate metal film on a substrate and forming a gate line by patterning the gate metal film;
    Step 12 of sequentially depositing a first insulating layer and a structural layer for forming a gate electrode and a pixel electrode on the substrate after the Step 11, and forming the gate electrode and the pixel electrode by patterning the structural layer;
    Step 13 of sequentially depositing a second insulating layer, a semiconductor film and a doped semiconductor film on the substrate after the Step 12, and forming an active layer and a first via hole, a second via hole and a third via hole provided in the second insulating layer by patterning the stack of the above layers, wherein the active layer comprises a semiconductor layer and a doped semiconductor layer and is positioned on the gate electrode, the first via hole is positioned at the pixel electrode, the second via hole is positioned at the gate electrode and the third via hole is positioned at the gate line;
    Step 14 of depositing a source/drain metal film on the substrate after the Step 13, and forming a data line, a drain electrode, a source electrode and a connection electrode by patterning the source/drain metal film, wherein the source electrode is positioned on the active layer and connected with the data line, the drain electrode is positioned on the active layer and connected with the pixel electrode through the first via hole, one end of the connection electrode is connected with the gate electrode through the second via hole and the other end thereof is connected with the gate line through the third via hole; and Step 15 of depositing a third insulating layer on the substrate after the Step 14.

11. The method of manufacturing the TFT-LCD array substrate according to claim 10, wherein, in forming the gate line by patterning the gate metal film, a blocking layer is further formed, and the blocking layer is provided below the gate electrode to be formed.

12. The method of manufacturing the TFT-LCD array substrate according to claim 10, wherein the third insulating layer is patterned to form a gate pad via hole in a gate pad region and a data pad via hole in a data pad region.

13. The method of manufacturing the TFT-LCD array substrate according to claim 10, wherein the Step 13 comprises: patterning the stack of the second insulating layer, the semiconductor film and the doped semiconductor film by using a half-tone mask or a gray-tone mask.

14. The method of manufacturing the TFT-LCD array substrate according to claim 10, wherein the structural layer in the Step 12 comprises a transparent conductive film, and the gate electrode and the pixel electrode are formed by patterning the transparent conductive film.

15. The method of manufacturing the TFT-LCD array substrate according to claim 10, wherein the structural layer in the Step 12 comprises a metal film for the gate electrode and a transparent conductive film for the pixel electrode.

16. The method of manufacturing the TFT-LCD array substrate according to claim 15, wherein in the Step 12, the transparent conductive film for the pixel electrode and the metal film for the gate electrode are sequentially deposited, and then the stack of the transparent conductive film for the pixel electrode and the metal film for the gate electrode are patterned by using a half-tone mask or a gray-tone mask to form the gate electrode and the pixel electrode, respectively.

* * * * *